US006854605B2

(12) United States Patent
Wrycraft

(10) Patent No.: US 6,854,605 B2
(45) Date of Patent: Feb. 15, 2005

(54) CABLE MANAGEMENT SYSTEM

(75) Inventor: Sean Conor Wrycraft, Harrow (GB)

(73) Assignee: Sun Microsystems, Inc., Santa Clara, CA (US)

( * ) Notice: Subject to any disclaimer, the term of this patent is extended or adjusted under 35 U.S.C. 154(b) by 125 days.

(21) Appl. No.: 10/166,509

(22) Filed: Jun. 10, 2002

(65) Prior Publication Data

US 2003/0226812 A1 Dec. 11, 2003

(51) Int. Cl.$^7$ ................................................ A47F 7/00
(52) U.S. Cl. ...................... 211/26; 361/826; 312/223.1; 211/187
(58) Field of Search ........................... 211/26, 151, 187, 211/168–174, 95–103, 80, 81, 85, 175; 312/223.1, 330.1, 223.2, 334.11, 334.4, 265.1, 265.4; 361/724–727, 825, 826

(56) References Cited

U.S. PATENT DOCUMENTS

| 4,614,383 | A | | 9/1986 | Polley et al. | |
|---|---|---|---|---|---|
| 5,443,312 | A | | 8/1995 | Schluter | |
| 5,460,441 | A | | 10/1995 | Hastings et al. | |
| 5,571,256 | A | * | 11/1996 | Good et al. | 211/26 |
| 5,726,866 | A | | 3/1998 | Allen | |
| 5,890,602 | A | | 4/1999 | Schmitt | |
| 6,070,742 | A | | 6/2000 | McAnally et al. | |
| 6,142,590 | A | * | 11/2000 | Harwell | 312/223.1 |
| 6,305,556 | B1 | * | 10/2001 | Mayer | 211/26 |
| 6,373,707 | B1 | | 4/2002 | Hutchins | |
| 6,424,534 | B1 | | 7/2002 | Mayer et al. | |
| 6,435,354 | B1 | * | 8/2002 | Gray et al. | 211/26 |
| 6,442,030 | B1 | | 8/2002 | Mammoser et al. | |
| 6,523,918 | B1 | * | 2/2003 | Baiza | 211/26 |
| 6,685,033 | B1 | | 2/2004 | Baddour et al. | |
| 2001/0037985 | A1 | | 11/2001 | Varghese et al. | |
| 2003/0222034 | A1 | | 12/2003 | Champion et al. | |
| 2003/0227753 | A1 | | 12/2003 | Wrycraft | |

OTHER PUBLICATIONS

Office Action received in copending application Ser. No. 10/166,529 (Publ. No. U.S.2003–0227753).

* cited by examiner

Primary Examiner—Carl D. Friedman
Assistant Examiner—Jennifer E. Novosad
(74) Attorney, Agent, or Firm—Meyertons Hood Kivlin Kowert & Goetzel, P.C.; B. Noël Kivlin

(57) ABSTRACT

A rack for an electronics assembly may have a supporting frame and a slider mechanism with a first part that is supported by the frame and a second part that supports the electronics assembly. The slider mechanism may be configured to allow the assembly to be moved out of the rack. The rack may further include a cable management system for supporting cables located at the rear of the assembly. The cable management system may have an articulated arm with a first end coupled to the assembly and a second end coupled to the first part of the slider mechanism so that bending of the arm accommodates movement of the electronics assembly. The cable management system may allow the assembly to be pulled out of the rack by the required distance irrespective of the depth of the rack.

17 Claims, 7 Drawing Sheets

CABLE MANAGEMENT SYSTEM

BACKGROUND OF THE INVENTION

The present invention relates to electronics assemblies, and is primarily concerned with racked assemblies. Many such assemblies will be located in racks for housing in for example nineteen inch cabinets, or other size cabinets such as twenty three inch or metric cabinets. The assemblies may for instance be employed as servers for a number of systems, for example in local area networks (LANS), wide area networks (WANs), telecommunications systems or other operations such as database management or as internet servers.

Such an assembly will typically comprise a supporting chassis that houses a motherboard or backplane and a number of daughterboards or module cards that extend in planes generally perpendicular to the plane of the motherboard and which are connected to the motherboard by connectors, e.g. high density connectors, so that the daughterboards can simply be located on guides and pushed toward the motherboard in order to connect them to it. An assembly will typically have dimensions in the order of 0.5 m in each direction and will be located in an enclosure, for example a cabinet, in an office, data centre, computer room or similar environment. Often, more than one such assembly is located in the same enclosure, and will need to be accessed from time to time for routine maintenance, repair or upgrading.

In order to enable a service engineer to access an assembly located in such an enclosure, the enclosure will normally comprise a supporting frame and a slider mechanism, one part of which is fixed on the supporting frame and the other part of which supports the electronics assembly, so that the assembly can be pulled out of the enclosure on the slider mechanism, and then, after work has been conducted on the assembly, can be pushed back into the enclosure. The slider mechanism will need to allow the assembly to be pulled out by at least the depth of the assembly, for example 0.5 m, in order to allow access to the rear parts thereof. The electronics assembly will usually have a large number of electrical cables, possibly including optical cables, extending from the rear thereof to the enclosure and beyond, and it is therefore necessary either to disconnect all interface and power cables whenever the assembly is withdrawn from the enclosure or to provide some form of cable management system that will support a service loop of cables having a length at least equal to the distance by which the assembly is moved as it is withdrawn from the enclosure.

Such cable management systems conventionally have taken the form of an articulated arm, one end of which is connected to the electronics assembly, and the other end of which is mounted on a rear part of the interior of the enclosure, so that the arm can accommodate movement of the assembly on the slider mechanism by bending and straightening. However, enclosures for such assemblies are manufactured in a range of different sizes. Their width is normally in the region of 19 inches (0.5 m), hence their name, but their depth can vary by quite a large degree, and it has been necessary to manufacture such cable management systems in a number of different sizes to suit the sizes of cabinets in which the assemblies are accommodated, or to manufacture the cable management systems with articulated arms of adjustable length, which adds to the complexity of the system. In addition, when such assemblies are located in relatively deep cabinets, the articulated arms of the cable management system are not fully bent when the assembly is fully inserted into the enclosure, which means that the distance the assembly can be pulled out of the enclosure is correspondingly reduced unless a more complex cable management system, for example involving articulated arms having three or more articulated members, is employed.

SUMMARY OF THE INVENTION

According to one aspect of the present invention there is provided a rack for an electronics assembly comprising:
(i) a supporting frame;
(ii) a slider mechanism having a first part that is supported by the frame and a second part that supports the electronics assembly, the mechanism configured to allow the assembly to be moved out of the rack; and
(iii) a cable management system for supporting cables located at the rear of the assembly which comprises an articulated arm having a first end coupled to the assembly and a second end coupled to the first part of the slider mechanism so that bending of the arm accommodates movement of the electronics assembly.

By locating the fixed part of the cable management system on the slider mechanism rather than on the rack or cabinet, it is possible to ensure that it is located as close as possible to the rear of the electronics assembly, irrespective of the depth of the rack, and the dimensions of the articulated arms are set, not by the depth of the enclosure, but by the depth of the assembly. It is thus possible to accommodate a range of different electronics cabinets with only a single and relatively simple form of cable management system. Of course, the cables will still normally need to extend to the rear of the rack, but since this does not involve any movement of the cable in operation of the system, it can simply be laid along the enclosure.

The second end of the articulated arm, that is, the end which is mounted on the first or fixed part of the slider mechanism, may be mounted on a bracket that acts as a stop to limit movement of the assembly. In this way, it is relatively easy to ensure that the second end of the cable management arm is fixed as close to the front of the rack as possible.

The rack may include a plurality of telescopic sliders, normally two sliders located horizontally on opposite sides of the electronics assembly. The telescopic sliders may comprise two parts, one fixed with respect to the rack, and the other attached to, and fixed with respect to, the movable electronics assembly. In the alternative, the sliders may be formed in three parts, one part fixed with respect to the rack, another part attached to and fixed with respect to, the movable assembly, and a third, intermediate, part that is joined to both the other parts and which moves an intermediate distance only when the assembly is pulled out of the rack. This configuration allows sufficient movement of the electronics assembly and ensures sufficient strength of maximum reach of the telescopic sliders.

The cable management system may comprise a single arm only, but it is also possible for it to comprise more than one arm. For example, one or more arms may be located on each of the telescopic sliders. Alternatively or in addition, one of the arms may be located above the or any other arm on the same slider. Such an arrangement in which more than one arm is employed enables the system to separate data cables from power cables by using different arms to support different types of cable.

The electronics rack will often include a plurality of substantially vertical posts that provide structural strength to the system, and in such a case, the posts will support the slider mechanism, and hence the electronics assembly. The rack may, for example include four posts, each of which is arranged in the region of a corner of the electronics assembly, but other numbers of posts may be used. For example, it is possible for the rack to include two posts only, each of which is arranged on the region of a side of the electronics assembly. In this form of rack, it may not be possible to fix the second end of the articulated arm to any other part.

The or each articulated arm may comprise a plurality of members that are concatenated by means of hinges. For example the or each arm may comprise two members that are joined by a hinge and each of which is attached at its other end to one of the electronics assembly or to the enclosure. In this case, each member forming the articulated arm may have a length in the region of the width of the electronics assembly in order to maximize the reach of the arm. However, other forms of arm are also possible. For example, the arm may have three members each of which is joined to the or each adjacent member by a hinge. Such an arm will have a substantially AZ@ shape in which one end is joined to the left band side of the enclosure or assembly, and the other end is joined to the right hand side of the assembly or enclosure respectively. In another form, of system, the articulated arm may have four concatenated members that are joined by three hinges. In this design of system, the two outer members of the arm maybe attached to the electronics assembly and to the fixed part of the slider mechanism respectively, and the hinge connecting the two inner members may be connected to an intermediate part of the telescopic slider.

According to another aspect, the invention provides a slider mechanism for supporting an electronics assembly and allowing the assembly to move into and out of a rack, which comprises:

(i) a first part which, in use, is stationary, and (ii) a second part which, in use, is attached to and moves with the electronics assembly;

(iii) a cable management system for supporting cables located at the rear of the assembly, which comprises an articulated arm having a first end which is attachable to the assembly and a second end which is mounted on the first part of the slider mechanism so that bending of the arm accommodates movement of the electronics assembly.

According to yet another aspect, the invention provides an electronics assembly which comprises;

(i) a chassis;

(ii) rack that supports the chassis;

(iii) a slider mechanism that supports the chassis on the rack and has a first part that is mounted on the rack and a second part that supports the electronics assembly to allow the assembly to be moved with respect to the rack; and (iv) a cable management system which comprises an articulated arm having a first end which is attached to the assembly and a second end coupled to the first part of the slider mechanism so that bending of the arm accommodates movement of the electronics assembly.

BRIEF DESCRIPTION OF THE DRAWINGS

Embodiments of the present invention will now be described in detail by way of example with reference to the accompanying drawings, in which corresponding parts are given like reference numbers. In the drawings.

DESCRIPTION OF PARTICULAR EMBODIMENTS

Figure 1:
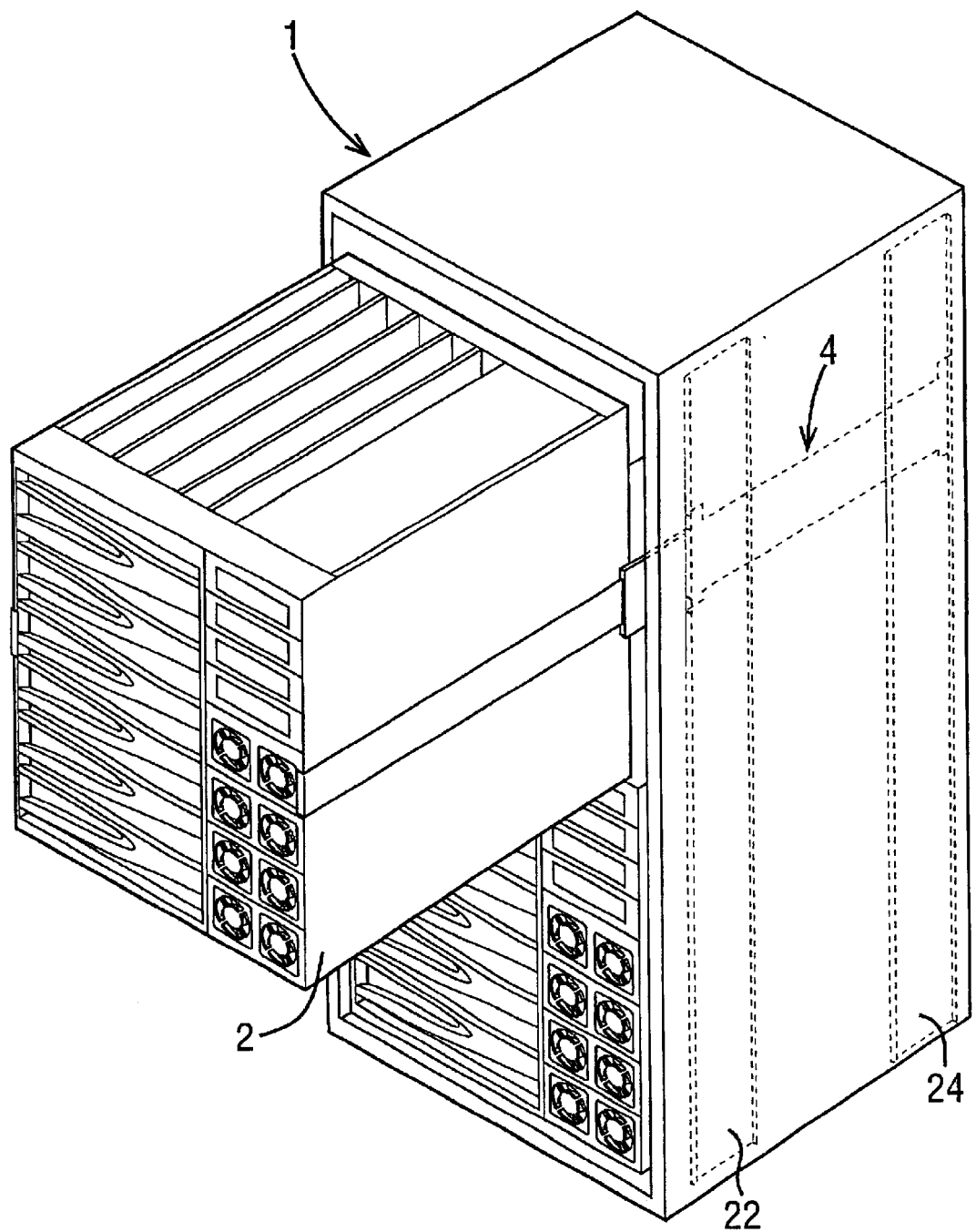
FIG. 1 is a schematic perspective view of a cabinet sure that houses a pair of electronics assemblies.

Referring now to the drawings, in which like reference numerals are used to designate corresponding elements, FIG. 1 shows an electronics cabinet 1 for a nineteen inch rack that houses a pair of electronics assemblies 2 although other sizes of cabinet may be employed. Such electronics assemblies may be employed for a number of services, for example as part of a local area network (LAN) or for telecommunications purposes. Each assembly typically comprises a chassis that contains a motherboard and a number of daughterboards that are arranged in parallel planes to one another and connected to the motherboard. In addition, other components such as power modules, hard disc drives, tape drives etc. may be present.

Figure 2:
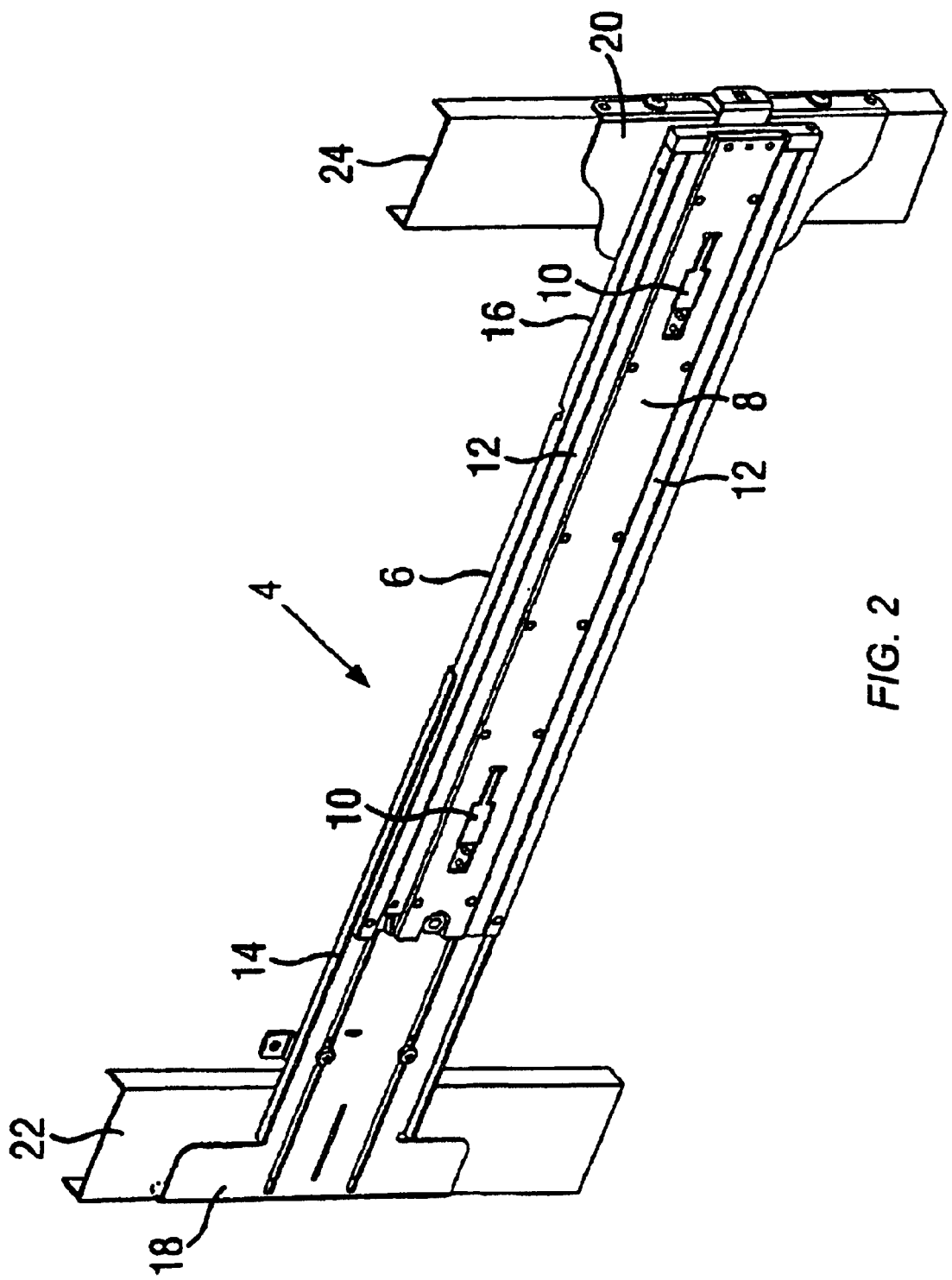
FIG. 2 is a schematic view of part of a slider mechanism employed in the cabinet of FIG. 1.

Both electronics assemblies 2 are supported within the cabinet 1 by means of slider mechanisms, each of which comprises a pair of telescopic sliders 4, one of which is located on each side of the cabinet (and therefore the assembly 2). One such telescopic slider 4 is shown in greater detail in FIG. 2, and comprises a fixed or stationary part 6, a movable part 8 that is attached to the chassis of the electronics assembly 2 by means of lugs on the chassis that engage recesses 10 in the movable part 8, and an intermediate part 12 that is joined to both the fixed part 6 and the movable part 8, and can slide easily with respect to the fixed and movable parts by means of a linear ball race (not shown). The fixed part 6 of the telescopic arm is, in fact, itself formed from two telescopically slidable elements 14 and 16 that terminate in brackets 18 and 20. The two elements 14 and 16 can be telescopically adjusted to alter the distance of separation of the brackets 18 and 20 so that the fixed part 6 of the telescopic arms can be fixed to posts 22 and 24 in any of a number of cabinets.

Because such assemblies by their nature will have a large number of cables, both data cables and power cables, entering and exiting from a rearwardly facing surface thereof, a cable management system is provided that comprises an articulated arm 26, one end 28 of which is attached to, and movable with, the electronics assembly, and the other end 30 of which is fixed with respect to the cabinet. The two members that form the articulated arm join at the mid point of the arm by means of a hinge 32 so that the articulated arm 26 can accommodate movement of the electronics assembly 2 into and out of the cabinet 1 by bending and straightening respectively.

Figure 3:
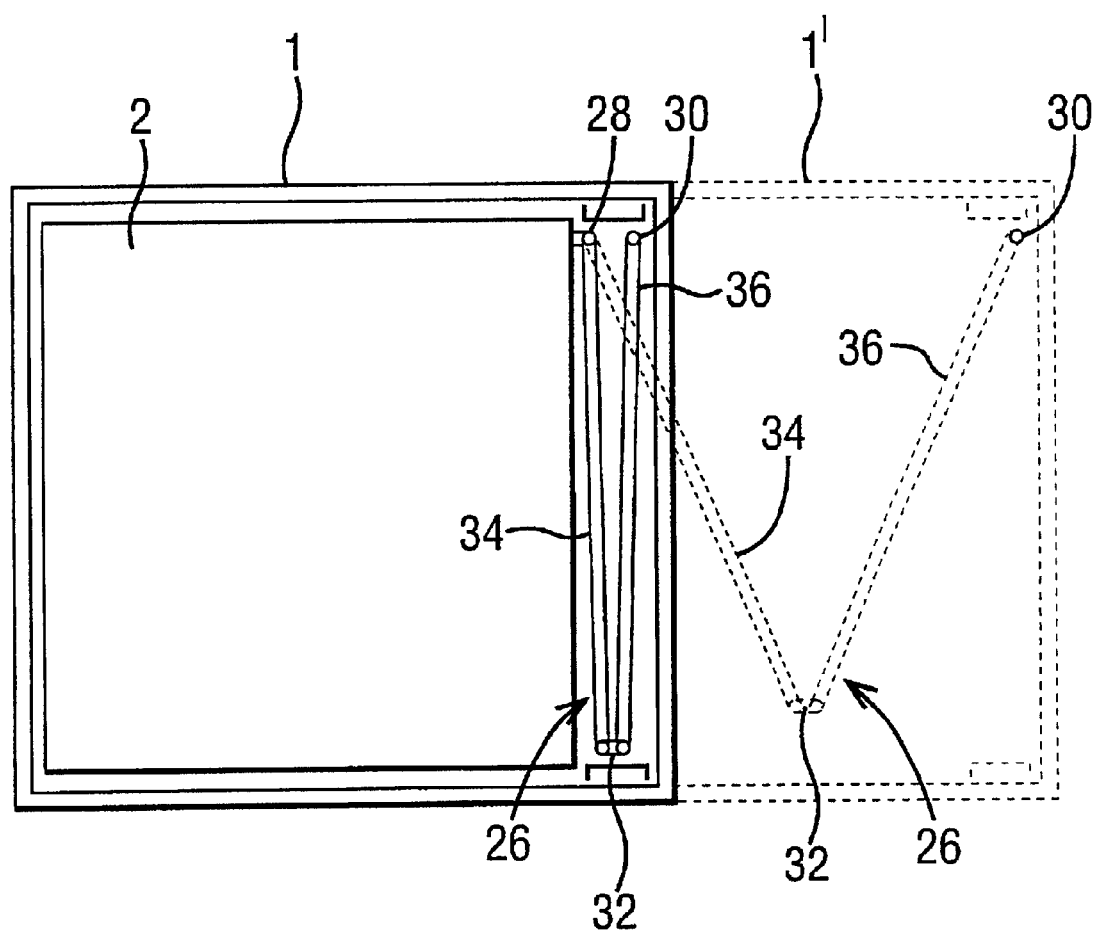
FIG. 3 is a section viewed from the top of a cabinet for an electronics assembly that incorporates a cable management system.

Conventionally, the end 30 of the articulated arm that is fixed with respect to the cabinet is attached to one of the posts 22 or 24 that provide structural rigidity to the cabinet. FIG. 3 is a plan view showing two cabinets 1 and 1' used for such systems that differ in depth. The front ends of the two cabinets are superimposed, and the rear part of cabinet 1' is shown in ghost lines. The two members 34 and 36 that together form the articulated arm 26 will normally have a length of the same order as the width of the assembly (about 0.5 m) in order to give the cable management arm 26 as great a reach as possible, and the rear, fixed end of the arm is attached to the rearmost post 24 of the cabinet. However, if the cabinet 1' is particularly deep, the cable management arm will not be fully collapsed when the assembly 2 is fully housed in the cabinet, and the extra depth of the cabinet will reduce the distance by which the cable management arm will allow the assembly to extend out of the front of the cabinet.

Figure 4:
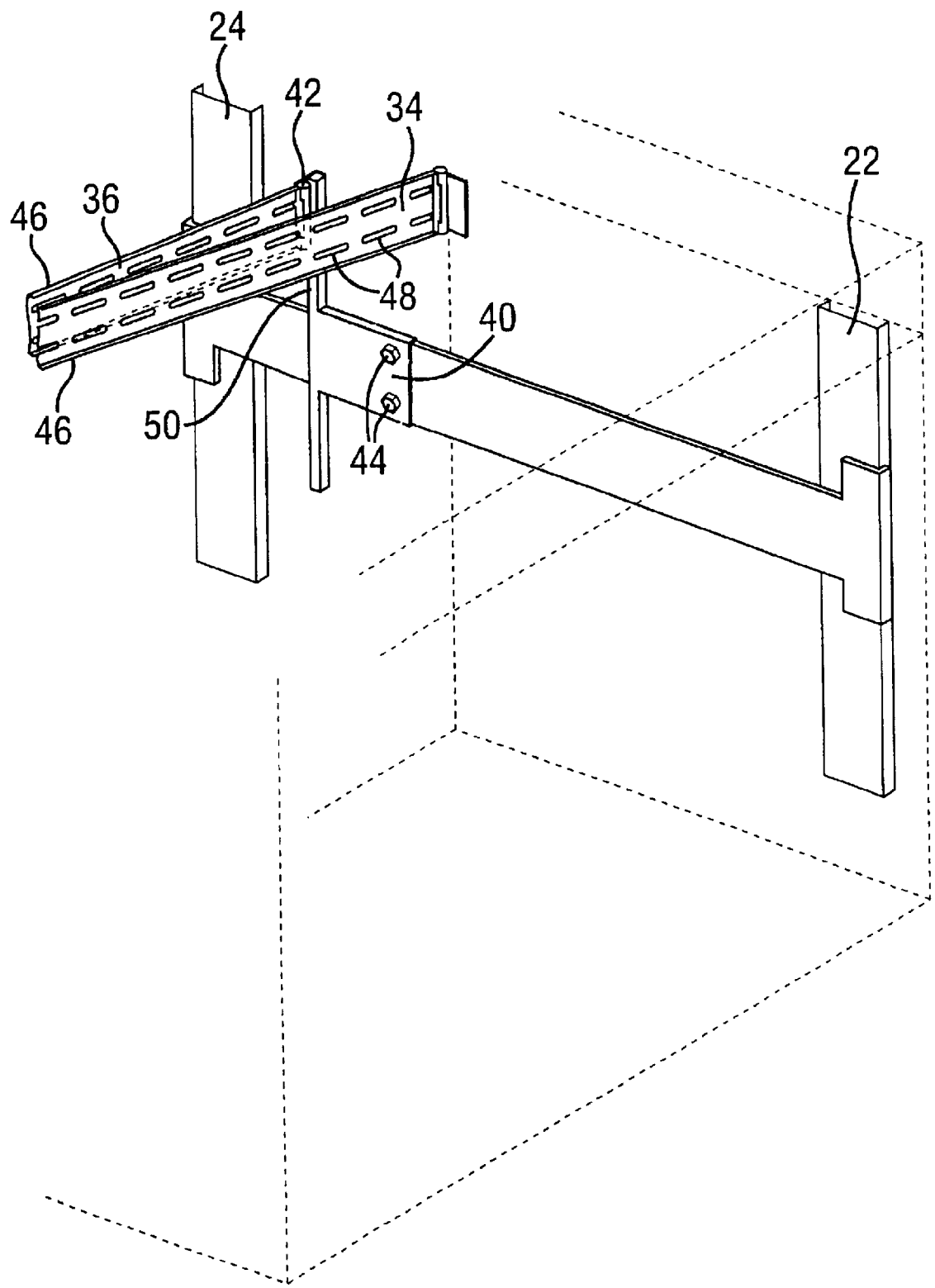
FIG. 4 is a schematic perspective view of part of an electronics cabinet according to the present invention.

FIGS. 3 and 4 show part of a cable management system according to the present invention. The cable management arm 26 comprises a pair of members 34 and 36, member 34 being attached to the rear of the electronics assembly 2, and the members being articulated by means of a hinge 32. In this system, however, the rear, fixed end of member 36 is attached to a bracket 40 that is located on the fixed part 6 of the telescopic slider 4 by means of a hinge 42. The hinge 42 of the articulated arm 26 is located on a rigid arm 50 extending vertically above the bracket 40 so that the hinge 42 and the articulated arm 26 are at the same height as the cable outlets at the upper part of the assembly 2. The corresponding rigid arm 50 extending below the bracket 40 is not used in this embodiment. The bracket 40 or other support can be located on the fixed part of the telescopic slider and can be moved along the slider until it is in its correct position, whereupon it can be secured in position by means of nuts and bolts 44. The bracket may, for example, be designed to have a length (that extends along the telescopic slider) that will be sufficient to accommodate the cable management arm 26 and any cabling, when the arm 26 is bent to its maximum extent. In FIGS. 3 and 4, the cables are not shown for the sake of clarity. The cabling, normally in the form of a number of cable bundles, will be located against the forward facing faces of members 34 and 36 between the flanges 46 thereon, and will be held in place by cable ties that are held by apertures 48 in the members.

Figure 5:
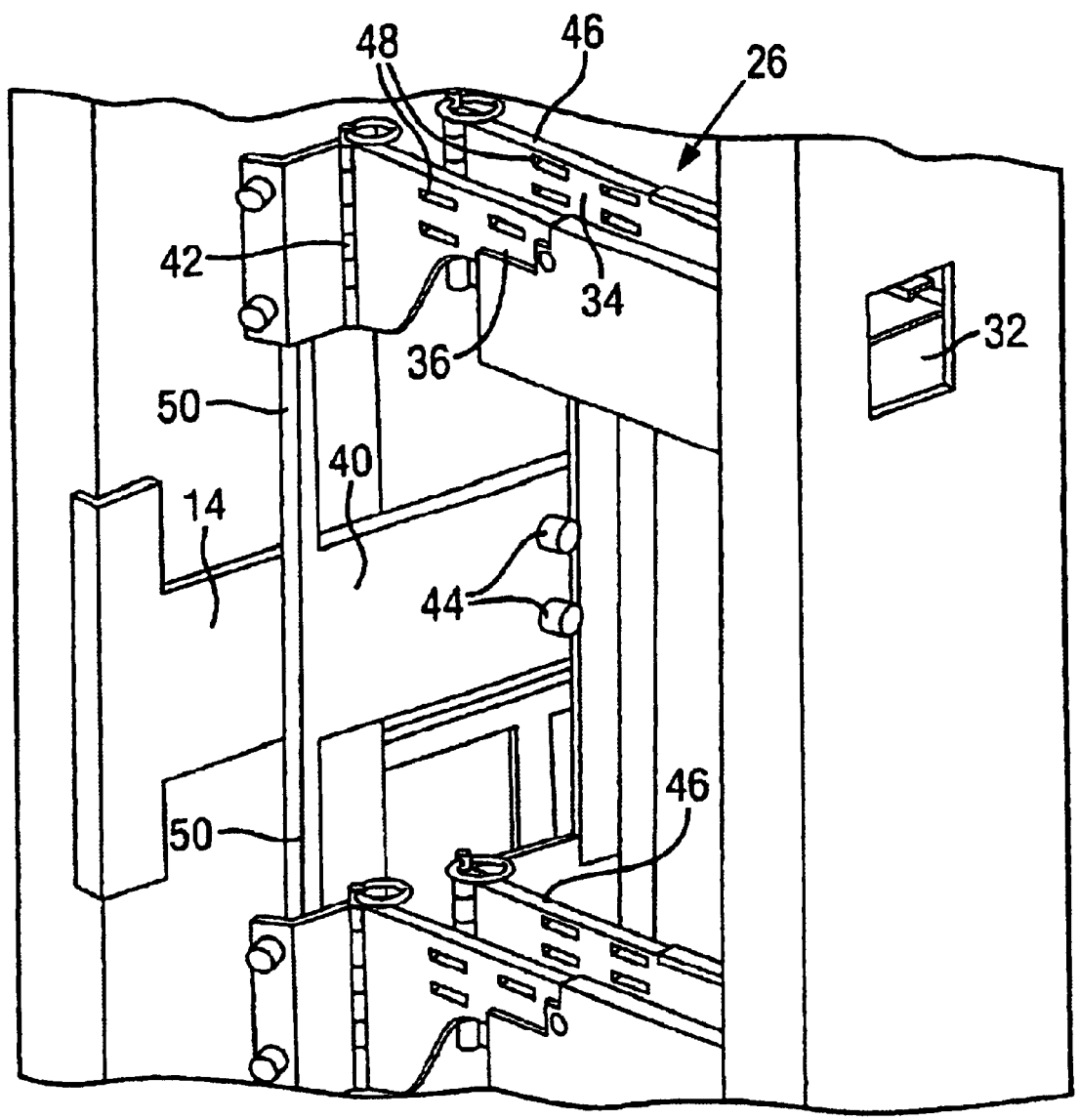
FIG. 5 is a perspective view of a cabinet according to another modification of the invention taken from a different angle to that of FIG. 4.

As shown in FIG. 4, only a single articulated arm is employed at the rear of the electronics assembly 2. In FIG. 5, two articulated arms 26 are employed, one arm being located by a vertical arm 50 extending above the bracket 40, while the other articulated arm is located on the vertical arm 50 extending below the bracket 40. Two articulated arms 26 as shown may be used where it is desired to separate physically electrical power cables from data cables. Alternatively, two articulated arms 26 that are supported by brackets 40 on opposite sides of the enclosure may be used.

Figure 6:
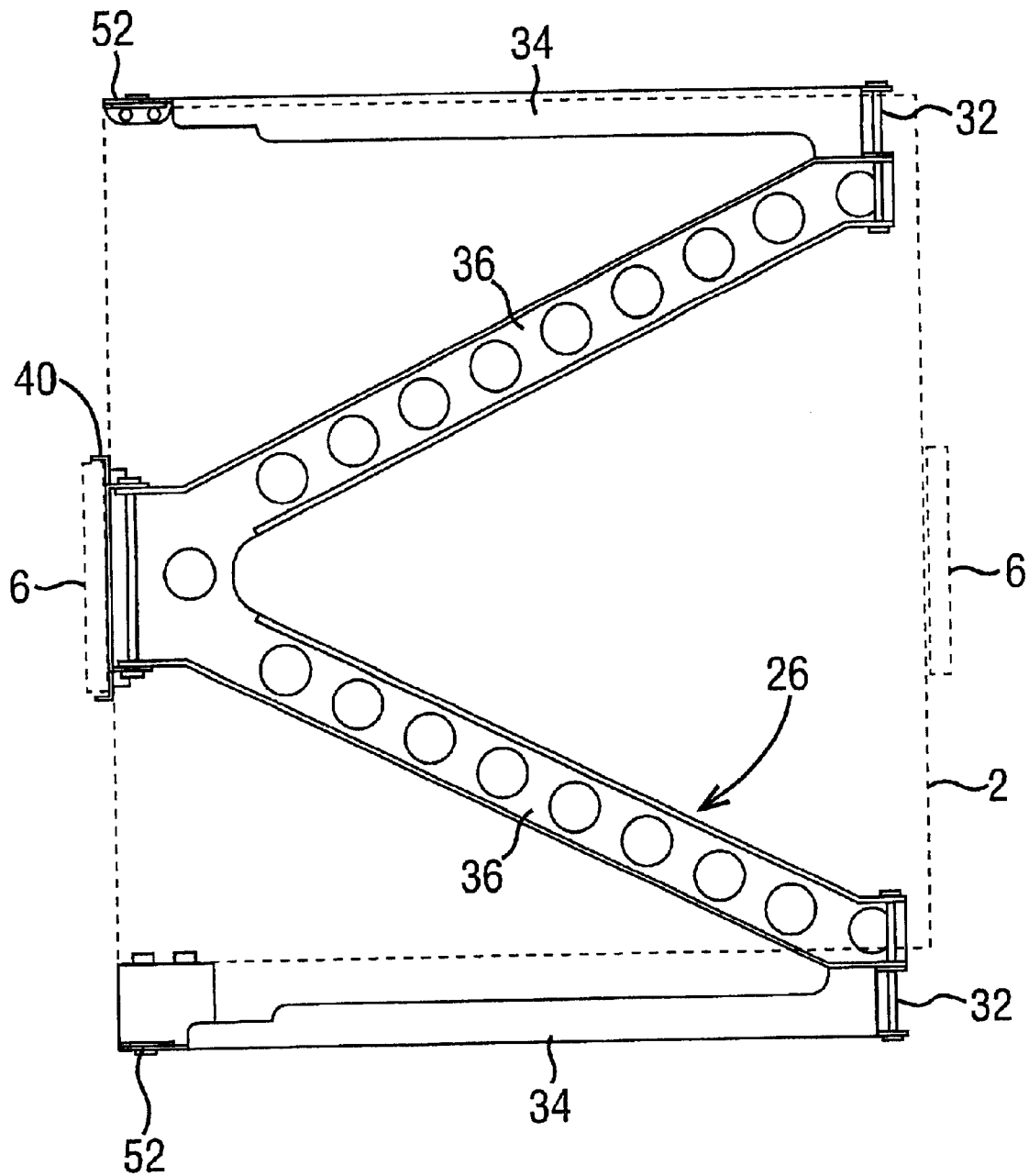
FIG. 6 shows a cabinet according to a different aspect of the invention.

Another embodiment of the present invention is shown in FIG. 6. In this embodiment, a pair of members 36 forming one part of the articulated arm 26 extend from a bracket 40, one member extending diagonally upwardly, and the other member extending diagonally downwardly, so that their ends remote from the telescopic arm 6 are at a height roughly equal to the top and bottom of the electronics assembly 2. Each member is joined by means of a hinge 32 to another member 34 that forms the other part of the articulated arm 26 and is joined to the rear face of the assembly by a bracket 52. Cabling leaving the assembly 2 in the region of the brackets 52 will then extend along members 34, around the hinge 32, along the members 36 to be collected in the region of the bracket 40. This embodiment operates in exactly the same way as the embodiment shown in FIG. 5, but the vertical height provided by the diagonally extending members 36 give the articulated arms 26 a greater strength and weight bearing capacity.

Figure 7:
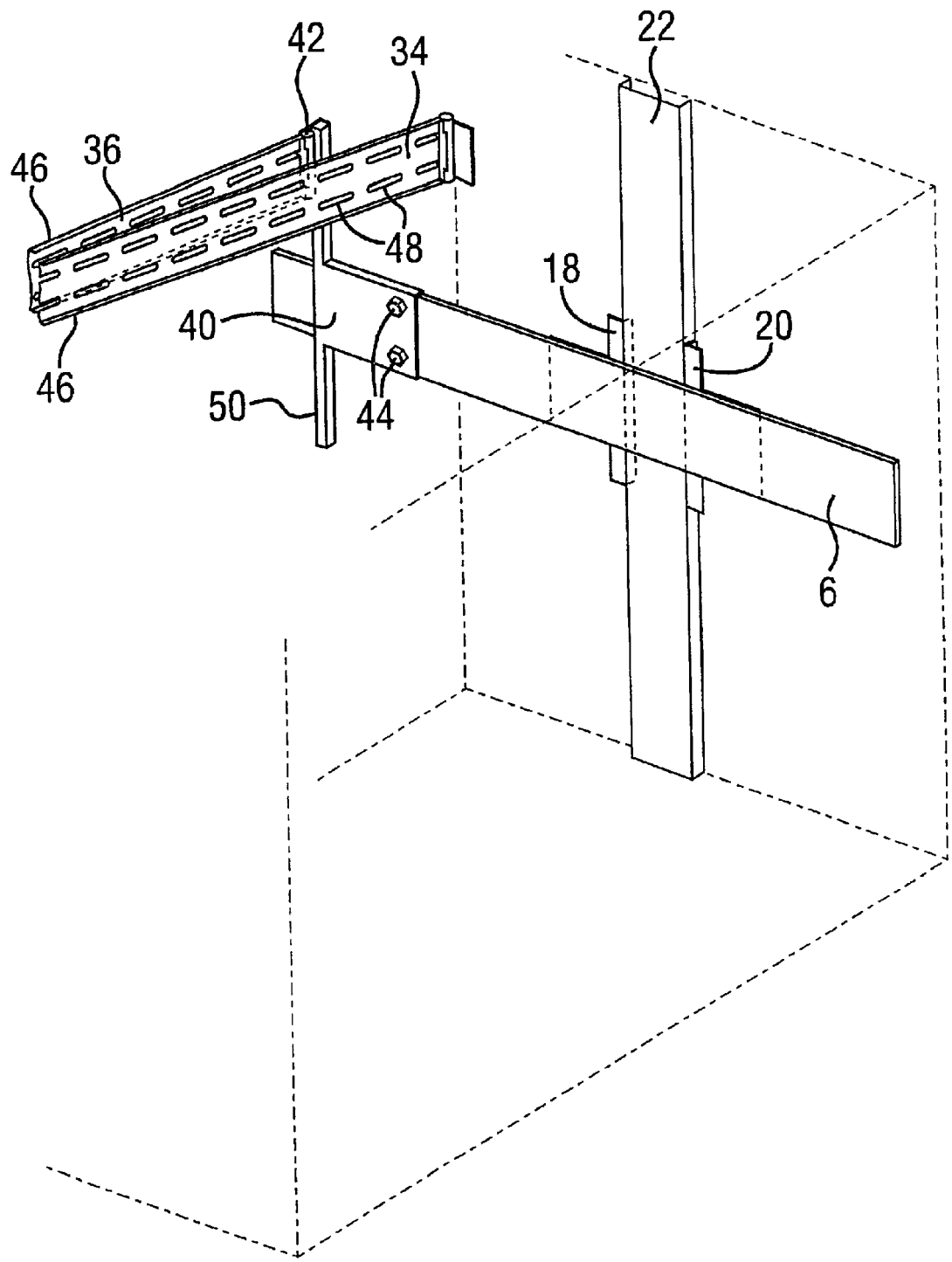
FIG. 7 shows a rack according to yet another aspect of the invention that employs only two posts.

Yet another embodiment of the present invention is shown in FIG. 7. This embodiment is generally the same as that shown in FIG. 4, but in this embodiment the rack comprises only two posts 22, one such post being located on either side of the electronics assembly. The brackets 18 and 20 that were provided at each end of the fixed part 6 of the telescopic slider have been rotated about a horizontal axis through 180° so that they are each located on opposite sides to the post 22 and fixed to it by means of nuts and bolts (not shown).

This form of rack may have an associated cabinet but need not do so.

The scope of the present disclosure includes any novel feature or combination of features disclosed therein either explicitly or implicitly or any generalization thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. A rack for an electronics assembly comprising:
   (i) a supporting frame;
   (ii) a slider mechanism having a first part that is supported by the frame and a second part for supporting the electronics assembly, the mechanism being configured to allow the assembly to be moved out of the rack; and
   (iii) a cable management system for supporting cables located at the rear of the assembly which comprises a bracket that can be located on the first part of the slider mechanism, moved along the first part of the slider mechanism and secured in position thereon, and an articulated arm having a first end for coupling to the assembly and a second end coupled to the bracket so that bending of the arm accommodates movement of the electronics assembly.

2. A rack as claimed in claim 1, wherein the slider mechanism comprises two telescopic sliders that are located on opposite sides of the electronics assembly.

3. A rack as claimed in claim 2, wherein the cable management system includes at least one further articulated arm.

4. A rack as claimed in claim 3, wherein at least one articulated arm is located on each of the sliders.

5. A rack as claimed in claim 3, wherein at least one articulated arm supports power cables, and at least one other articulated arm supports data cables.

6. A rack as claimed in claim 1, wherein the supporting frame includes a plurality of substantially vertical posts that support the slider mechanism.

7. A rack as claimed in claim 6, which includes four posts, each of which is arranged in the region of a corner of the electronics assembly.

8. A rack as claimed in claim 6, which includes two posts, each of which is arranged in the region of a side of the electronics assembly.

9. A rack as claimed in claim 1, wherein the articulated arm comprises two members that are joined together by a hinge.

10. A rack as claimed in claim 9, wherein each member has a length in the region of the width of the electronics assembly.

11. A rack for an electronics assembly comprising:
   (i) a supporting frame;
   (ii) a slider mechanism having a first part that is supported by the frame and a second part for supporting the electronics assembly, the mechanism being configured to allow the assembly to be moved out of the rack; and
   (iii) a cable management system for supporting cables located at the rear of the assembly which comprises an articulated arm having a first end for coupling to the assembly and a second end coupled to the first part of the slider mechanism so that bending of the arm accommodates movement of the electronics assembly, wherein the second end of the arm is mounted on the first part of the slider mechanism by a bracket that acts as a stop to limit movement of the assembly.

12. A rack for an electronics assembly comprising:
   (i) a supporting frame;
   (ii) a slider mechanism having a first part that is supported by the frame and a second part for supporting the electronics assembly, the mechanism being configured to allow the assembly to be moved out of the rack; and
   (iii) a cable management system for supporting cables located at the rear of the assembly which comprises a plurality of articulated arms, each arm having a first end for coupling to the assembly and a second end coupled to the first part of the slider mechanism so that bending of the arm accommodates movement of the electronics assembly, wherein one of the plurality of articulated arms is mounted on the electronics assembly above each other arm.

13. A slider mechanism for supporting an electronics assembly and allowing the assembly to move into and out of a rack, which comprises:
   (i) a first part which, in use, is stationary, and
   (ii) a second part which, in use, is attached to and moves with the electronics assembly;
   (iii) a cable management system for supporting cables located at the rear of the assembly, which comprises a bracket that can be located on the first part of the slider mechanism, moved along the first part of the slider mechanism and secured in position thereon, and an articulated arm having a first end which is attachable to the assembly and a second end which is mounted on the bracket so that bending of the arm accommodates movement of the electronics assembly.

14. A mechanism as claimed in claim 13, which comprises two telescopic sliders that are attachable to the electronics assembly.

15. A mechanism as claimed in claim 14, wherein the cable management system includes at least one further articulated arm.

16. A mechanism as claimed in claim 15, wherein at least one articulated arm is mounted on each telescopic slider.

17. An electronics assembly which comprises:
   (i) a chassis;
   (ii) rack that supports the chassis;
   (iii) a slider mechanism that supports the chassis on the rack and has a first part that is mounted on the rack and a second part that supports the chassis to allow the chassis to be moved with respect to the rack; and
   (iv) a cable management system which comprises a bracket that can be located on the first part of the slider mechanism, moved along the first part of the slider mechanism and secured in position thereon, and an articulated arm having a first end which is attached to the chassis and a second end coupled to the bracket so that bending of the arm accommodates movement of the chassis.

* * * * *